(12) United States Patent
Chang et al.

(10) Patent No.: US 8,310,388 B2
(45) Date of Patent: Nov. 13, 2012

(54) SUBRANGE ANALOG-TO-DIGITAL CONVERTER AND METHOD THEREOF

(75) Inventors: Soon-Jyh Chang, Tainan (TW);
Ying-Zu Lin, Tainan (TW);
Chun-Cheng Liu, Tainan (TW)

(73) Assignee: National Cheng Kung University, Tainan (TW)

( * ) Notice: Subject to any disclaimer, the term of this patent is extended or adjusted under 35 U.S.C. 154(b) by 75 days.

(21) Appl. No.: 13/050,449

(22) Filed: Mar. 17, 2011

(65) Prior Publication Data

US 2012/0154193 A1     Jun. 21, 2012

(30) Foreign Application Priority Data

Dec. 16, 2010 (TW) ................................. 99144332 A (51) Int. Cl.
*H03M 1/12* (2006.01)
(52) U.S. Cl. ........ 341/156; 341/158; 341/160; 327/337; 327/554; 702/107
(58) Field of Classification Search .......... 341/155–165; 327/337, 554; 702/107
See application file for complete search history.

(56) References Cited

U.S. PATENT DOCUMENTS

| | | | | | |
|---|---|---|---|---|---|
| 5,014,056 | A | * | 5/1991 | Moriwaki | 341/161 |
| 5,099,240 | A | * | 3/1992 | Nakatani et al. | 341/156 |
| 5,400,029 | A | * | 3/1995 | Kobayashi | 341/156 |
| 5,482,163 | A | * | 1/1996 | Hoffman | 206/534 |
| 5,621,409 | A | * | 4/1997 | Cotter et al. | 341/156 |
| 5,861,831 | A | * | 1/1999 | Murden et al. | 341/139 |
| 5,973,632 | A | * | 10/1999 | Tai | 341/156 |
| 6,204,790 | B1 | * | 3/2001 | Jin et al. | 341/145 |
| 6,570,523 | B1 | * | 5/2003 | Bacrania et al. | 341/155 |
| 6,831,585 | B2 | * | 12/2004 | Mulder et al. | 341/156 |
| 7,091,891 | B2 | * | 8/2006 | Bardsley et al. | 341/120 |
| 7,710,184 | B2 | * | 5/2010 | van der Goes et al. | 327/337 |
| 7,724,174 | B2 | * | 5/2010 | Chang et al. | 341/163 |

OTHER PUBLICATIONS

Ying-Zu Lin et al. "'A 9-bit 150-MS/s 1.53-m W Subranged SAR ADC in 90-nm CMOS" (pp. 243-244) 2010 Symposium on VLSI Circuits/Technical Digest of Technical Papers 2010 IEEE.

\* cited by examiner

*Primary Examiner* — Lam T Mai
(74) *Attorney, Agent, or Firm* — Volpe and Koenig, P.C.

(57) ABSTRACT

The configurations and adjusting method of a subrange analog-to-digital converter (ADC) are provided. The provided subrange ADC includes a X.5-bit flash ADC, a Y-bit SAR ADC and a (X+Y)-bit segmented capacitive digital-to-analog converter (DAC).

16 Claims, 12 Drawing Sheets

SUBRANGE ANALOG-TO-DIGITAL CONVERTER AND METHOD THEREOF

FIELD OF THE INVENTION

The application claims the benefit of Taiwan Patent Application No. 099144332, filed on Dec. 16, 2010, in the Taiwan Intellectual Property Office, the disclosures of which are incorporated herein in their entirety by reference.

The present invention relates to a subrange analog-to-digital converter (ADC). More particularly, it relates to a subrange ADC including a X.5-bit flash ADC, a Y-bit successive approximation analog-to-digital converter (SAR ADC) and a (X+Y)-bit segmented capacitive digital-to-analog converter (DAC).

BACKGROUND OF THE INVENTION

Figure 1:
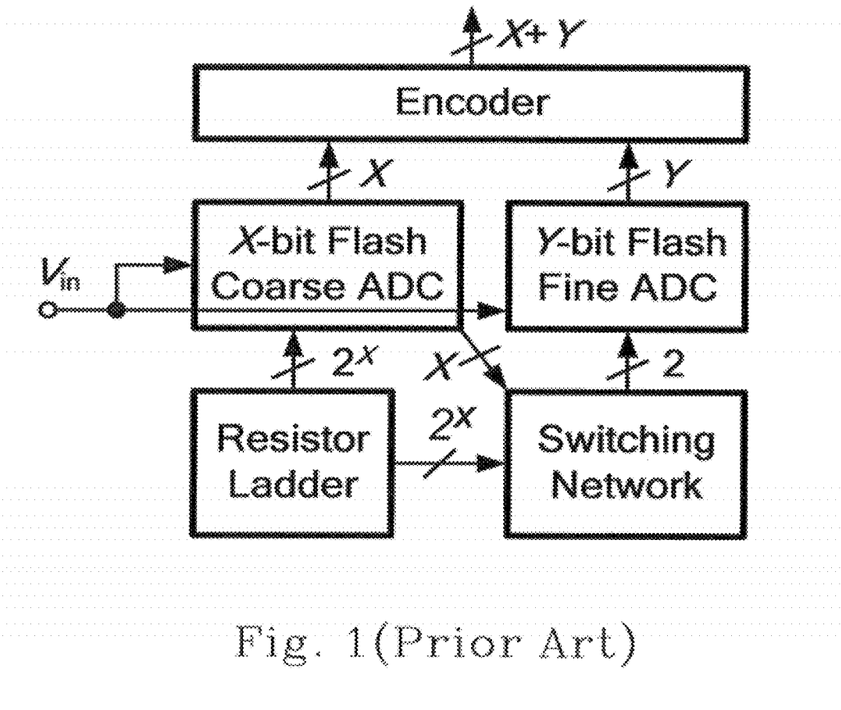
FIG. 1 is a schematic diagram of a conventional subrange ADC.
Figure 2:
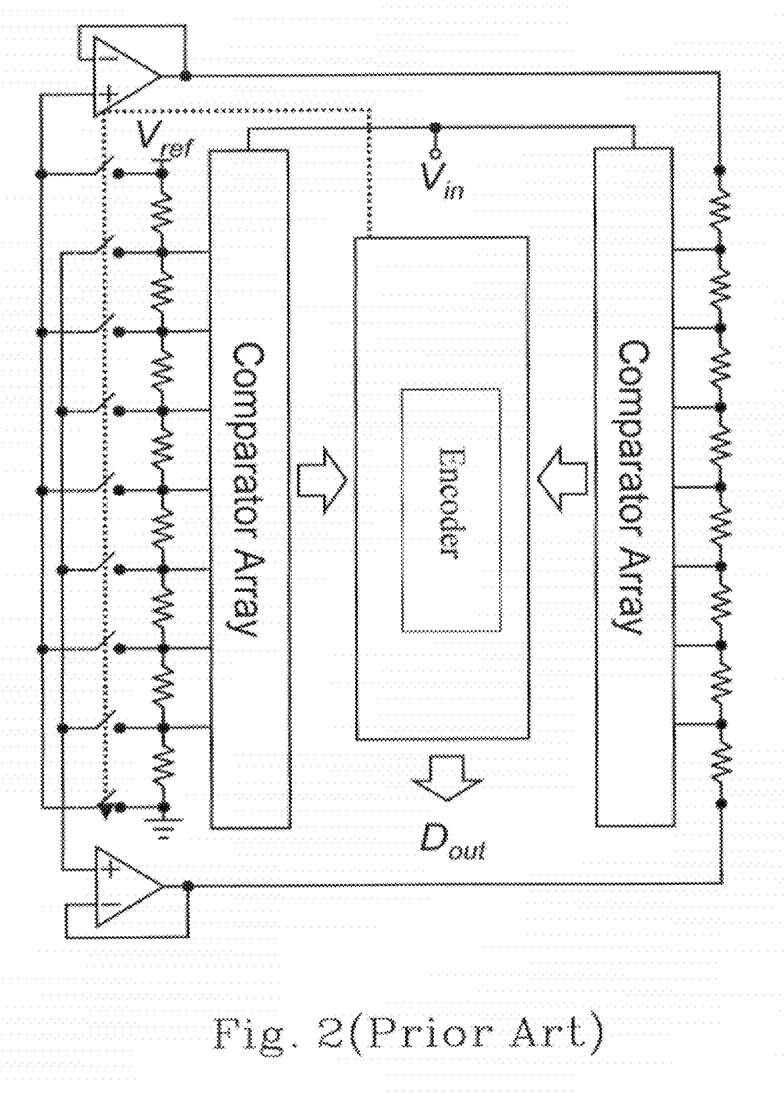
FIG. 2 is a schematic circuit diagram of a 6-bit embodiment of the conventional subrange ADC.
Figure 3:
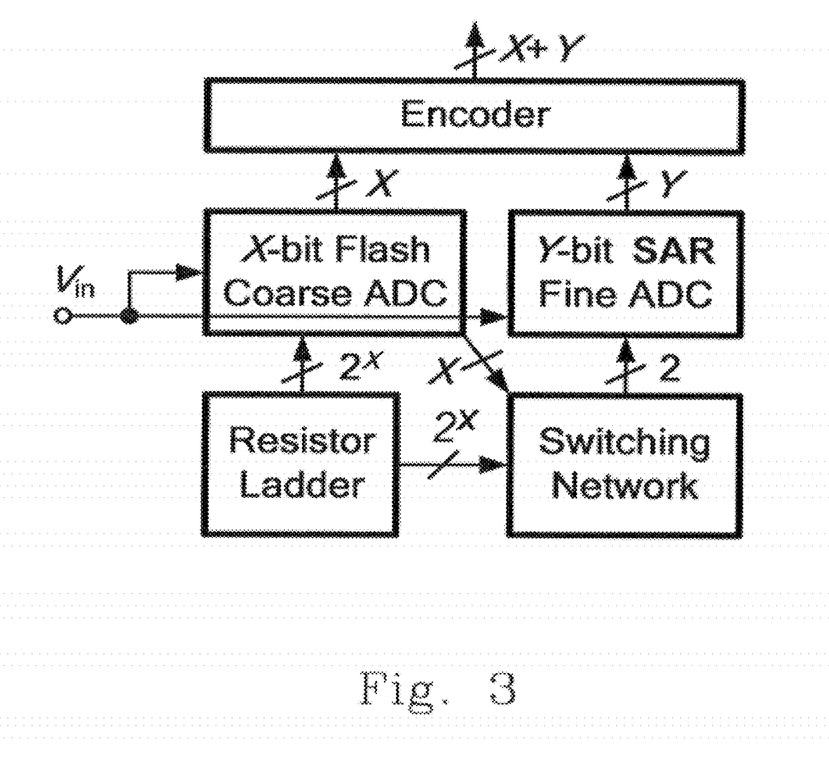
FIG. 3 is a schematic diagram of a subrange ADC comprising a flash ADC and a SAR ADC.
Figure 4:
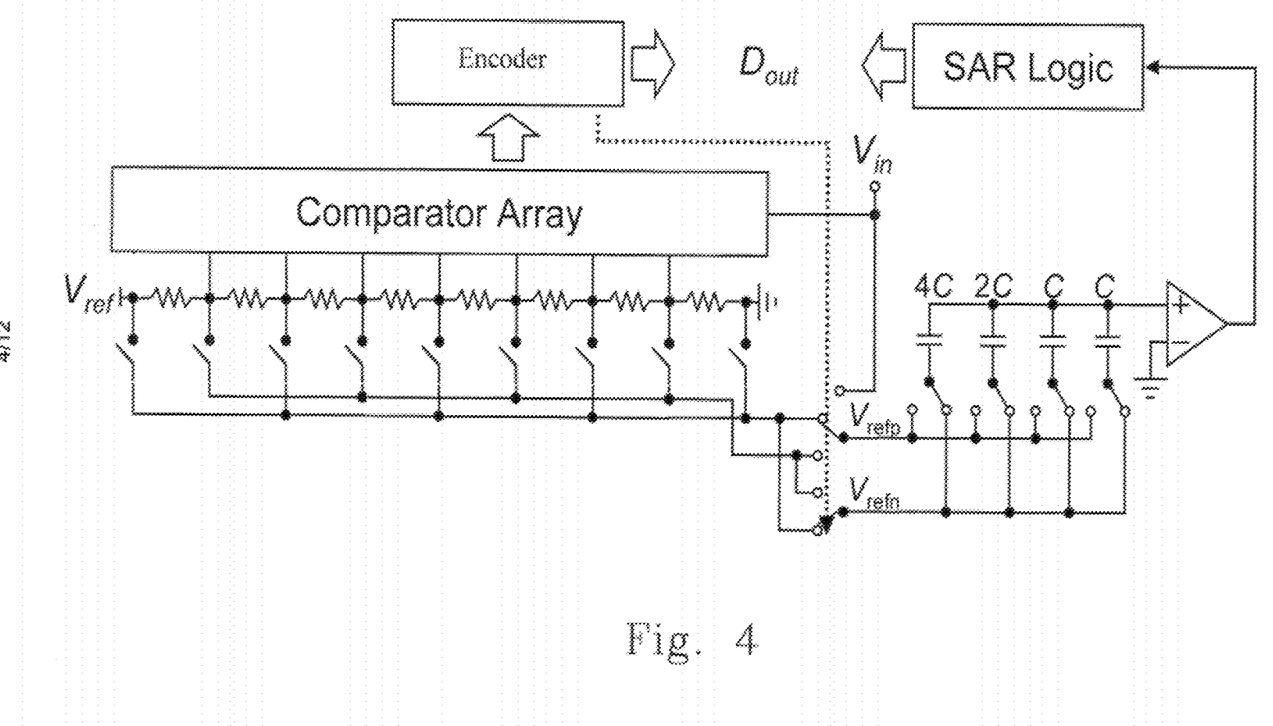
FIG. 4 is a 6-bit embodiment of the subrange ADC as shown in FIG. 3.

Conventionally, the subrange ADC includes two flash ADCs. FIG. 1 shows a schematic diagram of a conventional subrange ADC. In FIG. 1, the subrange ADC receives an input voltage Vin and includes a X-bit flash coarse ADC, a resistor ladder, a Y-bit flash fine ADC, a switching network and an encoder for generating a digital code having (X+Y) bits corresponding to an input voltage Vin. FIG. 2 is a 6-bit embodiment of the conventional subrange ADC as shown in FIG. 1, and the subrange ADC receives a reference voltage Vref and an input voltage Vin, generates the corresponding digital code Dout and includes an encoder, two comparator arrays, a plurality of switches and two buffers, each of which has a gain of 1. As for the configuration of the conventional subrange ADC, if the resolution of the coarse ADC is X bits, and the resolution of the fine ADC is Y bits, then the fine ADC requires a reference switching network to set the reference voltages required by the fine ADC. Comparing with the flash ADC, the subrange ADC requires a less number of comparators, but the subrange ADC requires a longer conversion time. Also, complex switching network results in high technical difficulty in designing high-speed and high-resolution subrange ADCs. Therefore, a subrange ADC with this kind of combination can seldom have a resolution higher than 8. Besides, a SAR ADC could achieve a high energy efficiency of analog-digital conversion, but the SAR ADC has to go through many cycles to finish a data conversion, and thus the operation speed is limited. In short, the SAR ADC has the characteristics of low power consumption, and the flash ADC has the advantage of high operational speed. To combine the flash ADC with the SAR ADC properly, a subrange ADC having high speed and low power consumption can be realized. FIG. 3 shows a schematic diagram of a subrange ADC comprising a flash ADC and a SAR ADC. As shown in FIG. 3, the subrange ADC is designed by intuition. In FIG. 3, the subrange ADC receives an input voltage Vin, and includes a X-bit flash coarse ADC, a resistor ladder, a Y-bit SAR fine ADC, a switching network and an encoder for generating a digital code having (X+Y) bits corresponding to an input signal (for generating the input voltage Vin). FIG. 4 is a 6-bit embodiment of the subrange ADC as shown in FIG. 3, the SAR ADC receives an input voltage Vin and a reference voltage Vref, generates the corresponding digital code Dout and includes a comparator array, a reference voltage generating circuit, a plurality of switches, a capacitor array receiving references voltages Vrefp and Vrefn, a comparator, a SAR logic and an encoder. However, the resistance value of the resistor ladder in the flash ADC is not allowed to be too small for the reason of low power consumption. Accordingly, the capacitor array driving the SAR ADC through the reference switching network has an RC time constant value usually not small, which will cause the settling speed of the reference voltage to be quite slow during this procedure, and the required conversion time is thus prolonged.

Generally speaking, the binary weighted capacitor array has a better linearity than the split capacitor array or the C-2C capacitor array so as to avoid the complex digital correction. But a drawback of the binary weighted capacitor array is that the capacitance value of its maximum bit is a sum of all the remaining bits. That means, to add a bit, the total capacitance value of the whole capacitor array will become doubled. When a high resolution version is designed, an overly large input capacitance value will limit the input bandwidth and result in that the capacitor switching requires even larger energy consumption. For a SAR ADC, after a comparison is ended and before the next comparison begins, the voltage value of the DAC in the SAR ADC must be confirmed to be settled enough to reach the required accuracy. During the whole conversion procedure, the capacitor having the maximum weight in the capacitor array (being one half of the whole capacitance value in the capacitor array) requires the longest settling time, and it is the main bottleneck of the operational speed of the SAR ADC. If the flash ADC is employed to speed up the first several capacitors with the maximum weights, then the whole subrange ADC only requires going through a large voltage variation once. As for the operations thereafter, since the capacitance of the capacitor with the maximum weight in the fine SAR ADC is significantly reduced, the settling time required is relatively shortened so as to have the advantages in speed.

Therefore, it is the intention of the present invention to combine the flash ADC with the SAR ADC so as to draw on the strong points to offset the weaknesses and to have the advantages of both the flash ADC and the SAR ADC.

Keeping the drawbacks of the prior arts in mind, and employing experiments and research full-heartily and persistently, the applicant finally conceived a subrange analog-to-digital converter and a method thereof.

SUMMARY OF THE INVENTION

It is therefore an object of the present invention to provide a subrange ADC includes a X.5-bit flash ADC, a Y-bit SAR ADC and a (X+Y)-bit segmented capacitive digital-to-analog converter (DAC), the flash ADC controls thermometer coarse capacitors of the DAC and the SAR ADC controls the binary fine capacitors; compared with a pure binary DAC, the thermometer DAC improves differential non-linearity (DNL), and due to that the flash ADC engages the analog-to-digital conversions of the X bits simultaneously, the sampling speed of the subrange ADC as a whole is also raised.

According to the first aspect of the present invention, a subrange analog-to-digital converter (ADC) with M bits comprises a positive and a negative input terminals, a first capacitor array having 2(2(N+1)−2) equivalent capacitors, each of which has a first and a second terminals, divided into N groups representing the first N bits of the M bits counted from a most significant bit (MSB) to a least significant bit (LSB), a successive approximation ADC (SAR ADC) including a second capacitor array having a plurality of bits and at least one capacitor with a first and a second terminals, wherein each the bit of the first and the second capacitor arrays electrically connects with at least one of the capacitors, the first terminal electrically connects with one of the positive and negative input terminals, and the second terminal switchably connects with a first and a second reference voltage sources to selectively receive a first and a second reference voltages, and a flash ADC receiving the first and the second reference voltages and a positive and a negative input voltages from the positive and the negative input terminals, generating two output signal sets, each of which has (2(N+1)−2) output signals, and simultaneously determining whether to adjust respective potential levels of the N bits represented by the N groups according to the two output signal sets.

According to the second aspect of the present invention, a subrange analog-to-digital converter (ADC) with M bits comprises a positive and a negative input terminals, a first capacitor array having 2(2(N+1)−2) capacitors, each of which has a first and a second terminals, divided into N groups representing the first N bits of M bits counted from a most significant bit (MSB) to a least significant bit (LSB), wherein each the bit electrically connects with at least one of the capacitors, the first terminal electrically connects with one of the positive and negative input terminals, and the second terminal switchably connects with a first and a second reference voltage sources to selectively receive a first and a second reference voltages, and a flash ADC comprising a reference voltage generating circuit formed by 2(N+1)−2 resistors electrically connected in series, receiving the first and the second reference voltages and a positive and a negative input voltages from the positive and the negative input terminals, and simultaneously determining whether to adjust potential levels of the bits of the N groups and a voltage value of the at least one of the capacitors, wherein except each of the first and the last resistors has a relatively higher first resistance, each of the remaining 2(N+1)−4 resistors has a relatively lower second resistance to generate a reference voltage required by an offset tolerance capability of the reference voltage generating circuit.

According to the third aspect of the present invention, a method for adjusting a subrange analog-to-digital converter (ADC) comprises steps of: providing 2(2(N+1)−2) capacitors, each of which has a first and a second terminals, and which capacitors are divided into N groups, wherein the N groups represent N bits, each of which electrically connects with at least one of the capacitors, the first terminal receives an input signal, and the second terminal selectively receives one of a first and a second reference voltages; comparing respectively a positive and a negative voltage values generated via the input signal with two sets of divided voltages to generate two sets of output signals; and determining simultaneously whether to adjust a voltage value of each the capacitor of each the bit of the N groups according to the two sets of 2(2(N+1)−2) output signals.

The present invention may best be understood through the following descriptions with reference to the accompanying drawings, in which:

DETAILED DESCRIPTION OF THE PREFERRED EMBODIMENT

Figure 5:
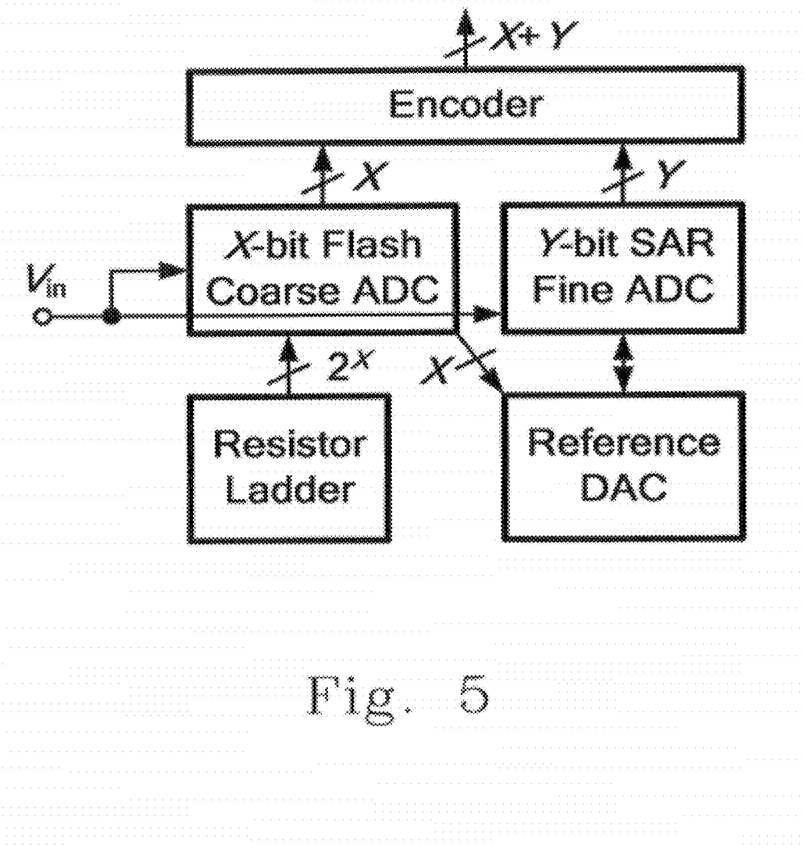
FIG. 5 is a schematic diagram of a subrange ADC comprising a flash ADC and a SAR ADC according to the first preferred embodiment of the present invention.
Figure 6:
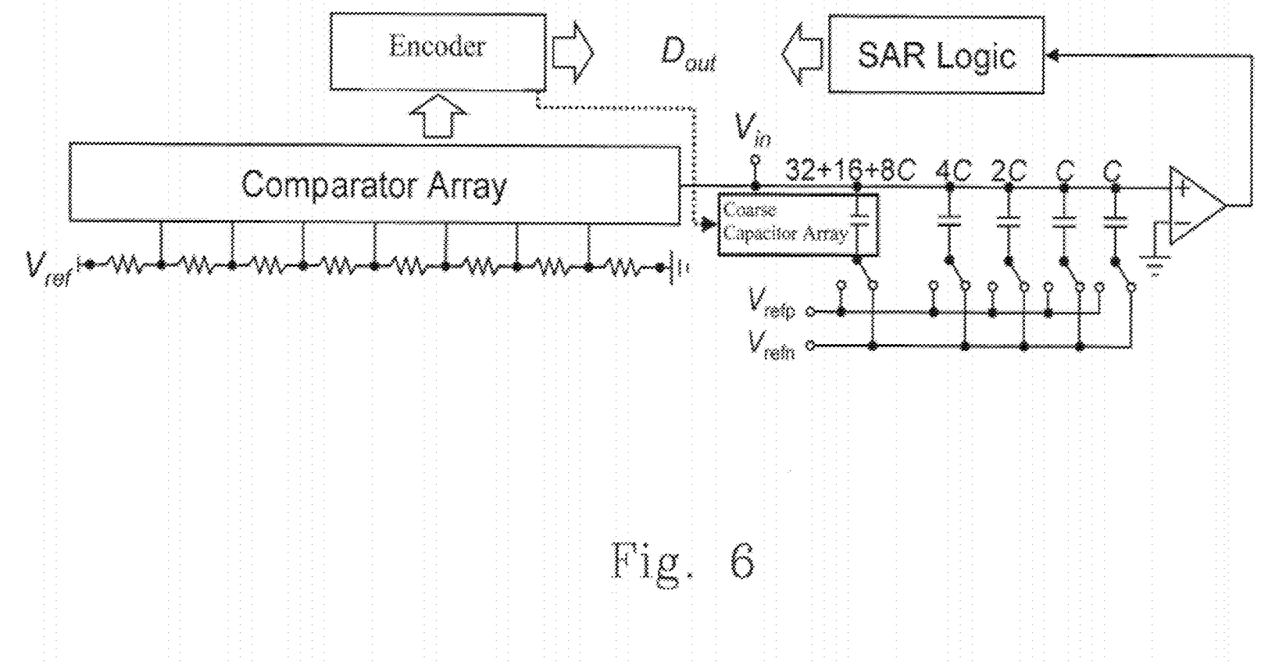
FIG. 6 is a schematic circuit diagram of a 6-bit subrange ADC comprising a flash ADC and a SAR ADC according to the first preferred embodiment of the present invention.

Different from the conventional way, the capacitor array having relatively simpler design is used in the present invention to generate the reference voltage required by the fine ADC. FIG. 5 shows a schematic diagram of a subrange ADC comprising a flash ADC and a SAR ADC. In FIG. 5, the subrange ADC receives an input voltage Vin, and includes a X-bit flash coarse ADC, a resistor ladder, a Y-bit SAR fine ADC, a reference DAC and an encoder for generating a digital code having (X+Y) bits corresponding to an input signal (for generating the input voltage Vin). FIG. 6 is a 6-bit embodiment of the subrange ADC as shown in FIG. 5, the SAR ADC receives an input voltage Vin and a reference voltage Vref, generates the corresponding digital code Dout and includes a comparator array, a reference voltage generating circuit, a plurality of switches, a capacitor array receiving references voltages Vrefp and Vrefn, a coarse capacitor array (32+16+ 8C, it is a first capacitor array), a fine capacitor array (4C+ 2C+C+C, it is a second capacitor array), a comparator, a SAR logic and an encoder. As shown in FIG. 5, the subrange ADC avoids the most complex reference voltage switching network of the conventional subrange ADC, and there is also no need to adjust the reference voltage through the large resistor of the resistor ladder so as to effectively avoid the problem that the settling speed of the reference voltage is relatively slow.

Figure 7:
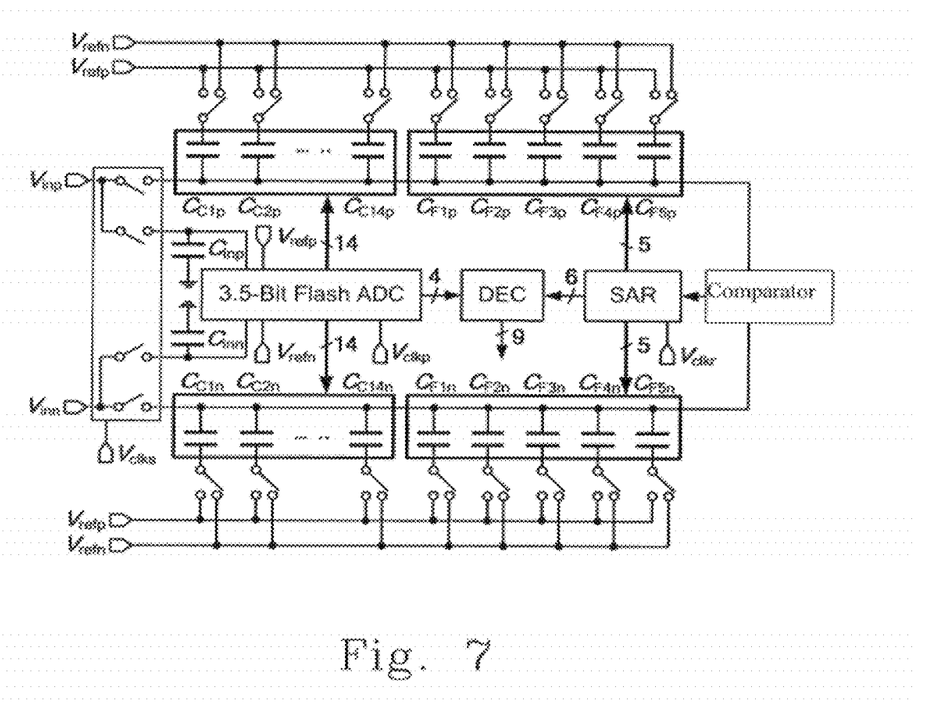
FIG. 7 is a schematic circuit diagram of a 9-bit subrange ADC comprising a 3.5-bit flash ADC and a 6-bit SAR ADC according to the first preferred embodiment of the present invention.

FIG. 7 shows a schematic diagram of a 9-bit subrange ADC comprising a 3.5-bit flash ADC and a 6-bit SAR ADC according to the first preferred embodiment of the present invention. According to the first preferred embodiment of the present invention, a subrange analog-to-digital converter (ADC) with M bits (e.g., an M-bit ADC) is provided and comprises a positive and a negative input terminals, a first capacitor array having 2(2(N+1)−2) equivalent capacitors, each of which has a first and a second terminals, divided into N groups representing the first N bits of the M bits counted from a most significant bit (MSB) to a least significant bit (LSB), a successive approximation ADC (SAR ADC) including a second capacitor array having a plurality of bits and at least one capacitor with a first and a second terminals, wherein each the bit of the first and the second capacitor arrays electrically connects with at least one of the capacitors ($C_{ci}=C_{c(i+1)}=C_{F5}$, $2C_{Fj}=C_{F(j+1)}$, where i=1-13 and j=1-4), the first terminal electrically connects with one of the positive input terminal (receiving Vinp) and the negative input terminal (receiving Vinn), and the second terminal switchably connects with a first and a second reference voltage sources to selectively receive a first and a second reference voltages, and a flash ADC receiving the first reference voltage (Vrefp) and the second reference voltage (Vrefn) and a positive voltage (Vinp) and a negative input voltage (Vinn) from the positive and the negative input terminals, generating two output signal sets, each of which has (2(N+1)−2) output signals, and simultaneously determining whether to adjust respective potential levels of the N bits represented by the N groups according to the two output signal sets.

As shown in FIG. 7, the subrange ADC further comprises a first and a second bootstrapped switches, an error correction circuit (DEC) and a comparator electrically connected to the positive and the negative terminals, wherein the positive and the negative input terminals receive an input signal, the input signal is a differential signal (generating the Vinp and the Vinn accordingly), the first and the second bootstrapped switches are respectively connected between the positive input terminal and the comparator, and between the negative input terminal and the comparator for completely passing the differential signal through the positive and the negative input terminals, the SAR ADC includes a first digital control circuit (not shown), the flash ADC includes a second digital control circuit (not shown), and the error correction circuit electrically connects with the SAR ADC and the flash ADC and generates a digital code matched to the input signal. The flash ADC is an N.5-bit flash ADC (here, 3.5-bit), generates N+1 output signals (here, 4 bits) and generates the digital code corresponding to the first N bits (here, 3 bits) via the error correction circuit (DEC) such that a generation of an offset is tolerated.

In FIG. 7, the second capacitor array is configured to be one of the remaining M−N bits and the remaining M−N−1 bits (here, M−N−1 bits, i.e. 9−3−1=5 bits) of the M bits, the comparator has a comparison result, the comparison result and a binary search algorithm are used to adjust respective potential levels of one of the remaining M−N bits and the remaining M−N−1 bits (here, adjusting M−N−1 bits, i.e. adjusting 9−3−1=5 bits of potential levels) of the M bits to generate the digital code, and a top plate sampling method is used to obtain the M−N bits of the digital code when the second capacitor array is configured to be the remaining M−N−1 bits.

Figure 8A:
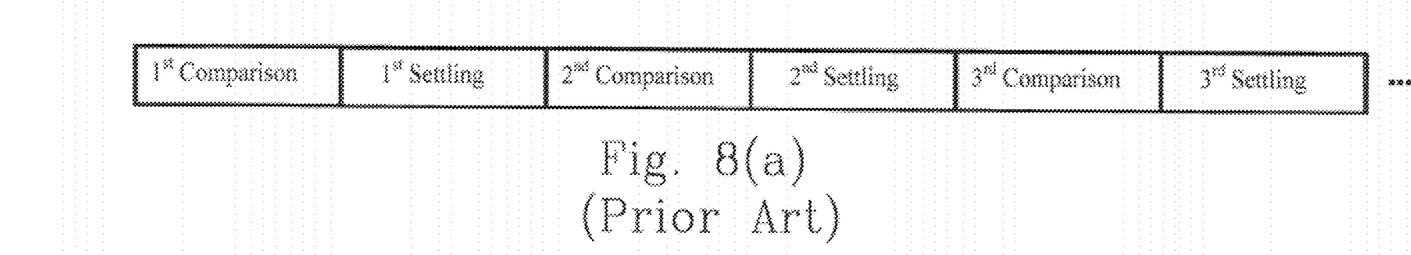
FIGS. 8(a) and 8(b) respectively show a timing diagram of a conventional SAR ADC and a timing diagram of a subrange ADC according to the present invention as shown in FIG. 7.
Figure 8B:
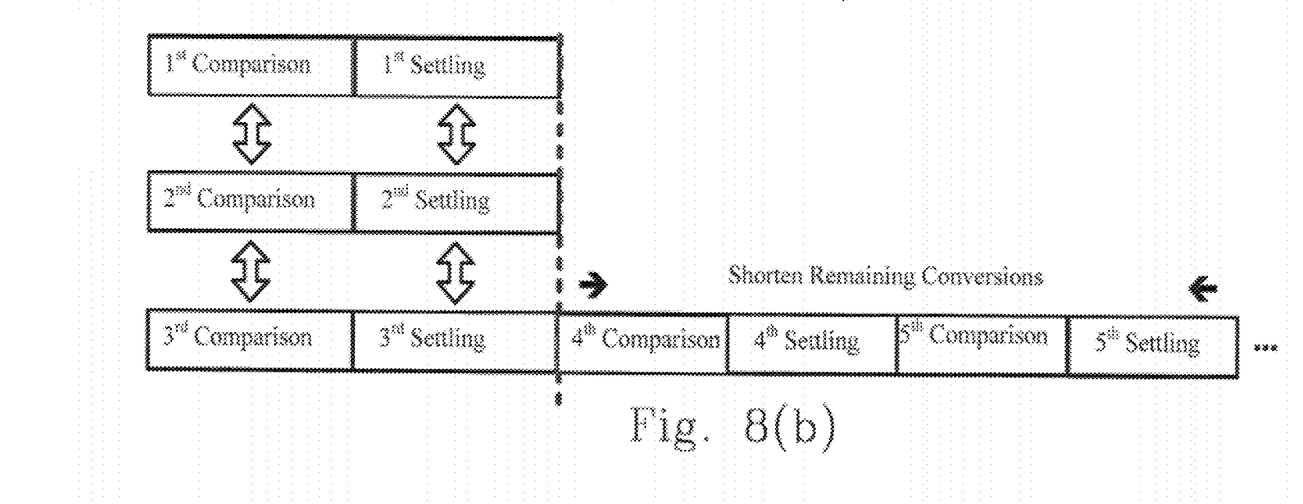

FIGS. 8(a) and 8(b) respectively show a timing diagram of a conventional SAR ADC and a timing diagram of a subrange ADC according to the present invention as shown in FIG. 7. Comparing FIG. 8(b) with FIG. 8(a), one could make a comparison between the timing sequences of a subrange ADC proposed in the present invention and a pure SAR ADC. Since the flash ADC of the proposed subrange ADC is employed to speed up the first several capacitors with the maximum weights (e.g., it is shown as 3 here) such that the whole subrange ADC only requires going through a large voltage variation once. As for the operations thererafter, since the capacitance of the capacitor with the maximum weight in the fine SAR ADC is significantly reduced, the settling time required is relatively shortened and the following several conversions becoming stable more quickly can be speed up to obtain an efficiency in speed.

Figure 9A:
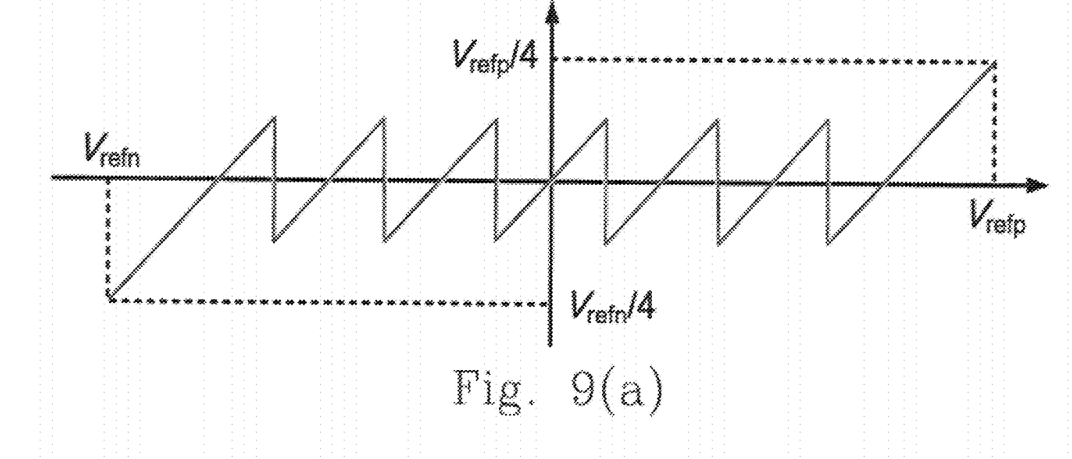
FIGS. 9(a) and 9(b) respectively show a waveform diagram depicting a residual plot after going through the flash ADC and a circuit diagram of a reference voltage generating circuit according to the first preferred embodiment of the present invention.
Figure 9B:
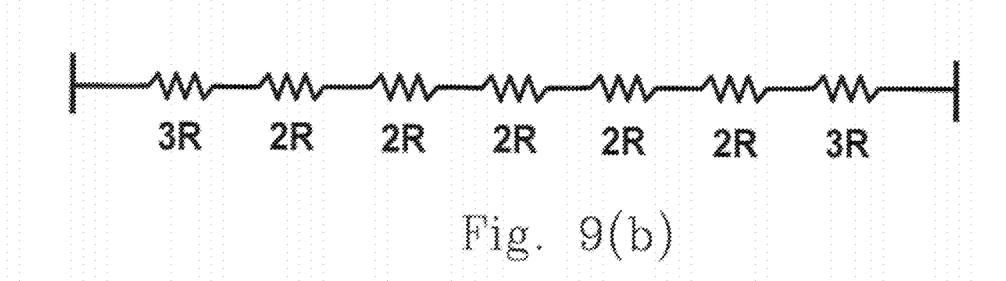

FIGS. 9(a) and 9(b) respectively shows a waveform diagram depicting a residual plot after going through the flash ADC and a circuit diagram of a reference voltage generating circuit according to the first preferred embodiment of the present invention. FIG. 9(a) is a residual plot generated after the proposed subrange ADC going through the first stage processing of the flash ADC. This plot is quite similar to the plot of a pipelined ADC, and the only difference is that the residue is not enlarged. Since this is not an integer bits structure, so that this structure could stand a certain extent of input voltage offset of the comparator. The advantage of this design of the present invention is that the accuracy of the flash ADC is only required to be maintained at 3 bits instead of to be raised to 9 bits in the present embodiment. In FIG. 9(b), a reference voltage generating circuit comprising 2(N+1)−2 resistors electrically connected in series of the flash ADC is shown, and except the first and the last resistors have a respective relatively higher first resistance (3R), the remaining 2(N+1)−4 resistors all have a respective relatively lower second resistance (2R) to generate a reference voltage (that is the input voltage value at the turning point of the residue plot), which is required so as to realize FIG. 9(a) and is required to ensure an offset tolerance capability of the reference voltage generating circuit.

Figure 10A:
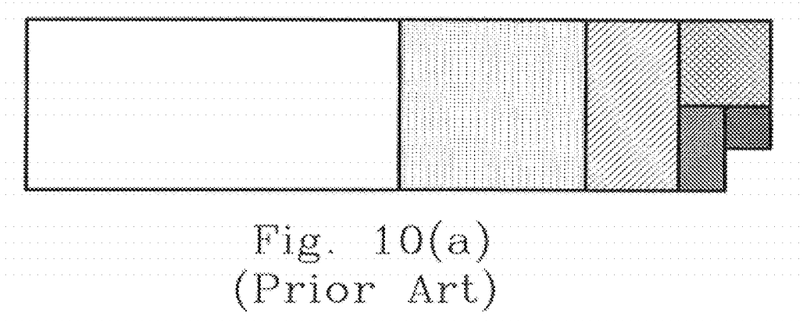
FIGS. 10(a) and 10(b) respectively show a schematic diagram of a binary weighted capacitor array according to a conventional SAR ADC and a schematic diagram of a segmented capacitor array according to the first preferred embodiment of the present invention.
Figure 10B:
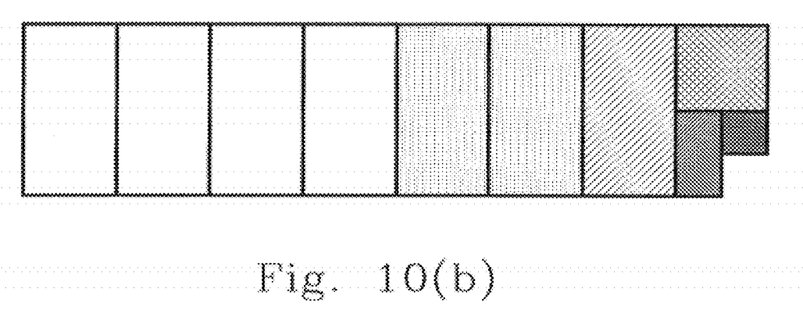

FIGS. 10 (a) and 10(b) are related to the conversions of capacitor arrays. Conventionally, the binary weighted capacitor array usually will have the worst differential nonlinearity (DNL) efficiency when the maximum bit is switched, but in the subrange ADC proposed in the present invention, the pure binary weighted form has been transformed into the segmented form (large capacitors are using thermometer code and the small capacitors are binary weighted) since the thermometer code outputted by the comparator array of the flash ADC is used. This kind of design could effectively improve the efficiency of DNL. Besides, one of the advantages of using the flash ADC as the front stage in the proposed subrange ADC is that the first several large capacitors are switched at the same time. For a SAR ADC, after a comparison is ended and before the next comparison begins, the voltage value of the DAC in the SAR ADC must be confirmed to be settled enough to reach the required accuracy. Here, the subrange ADC only requires going through a large voltage variation once. As for the operations thererafter, there is an advantage in speed since the capacitance of the capacitor with the maximum weight in the fine SAR ADC is significantly reduced.

The aforementioned first preferred embodiment of the present invention can be further generalized to become the second preferred embodiment of the present invention, which is a subrange analog-to-digital converter (ADC) with M bits (e.g., an M-bit ADC) and comprises a positive and a negative input terminals, a first capacitor array having 2(2(N+1)−2) capacitors, each of which has a first and a second terminals, divided into N groups representing the first N bits of M bits counted from a most significant bit (MSB) to a least significant bit (LSB), wherein each the bit electrically connects with at least one of the capacitors ($C_{ci}=C_{c(i+1)}=C_{F5}$, $2C_{F(j)}=C_{F(j+1)}$), where i=1-13 and j=1-4), the first terminal electrically connects with one of the positive input terminal (receiving Vinp) and the negative input terminal (receiving Vinn), and the second terminal switchably connects with a first and a second reference voltage sources to selectively receive a first reference voltage (Vrefp) and a second reference voltage (Vrefn), and a flash ADC comprising a reference voltage generating circuit formed by 2(N+1)−2 resistors electrically connected in series, receiving the first reference voltage (Vrefp) and the second reference voltage (Vrefn) and a positive input voltage (Vinp) and a negative input voltage (Vinn) from the positive and the negative input terminals, and simultaneously determining whether to adjust potential levels of the bits of the N groups and a voltage value of the at least one of the capacitors, wherein except each of the first and the last resistors has a relatively higher first resistance (e.g., 3R, see FIG. 9(b)), each of the remaining 2(N+1)−4 resistors has a relatively lower second resistance (e.g., 2R, see FIG. 9(b)) to generate a reference voltage required by an offset tolerance capability of the reference voltage generating circuit to stand for a relatively large offset of the positive and the negative input voltages. The 2(2(N+1)−2) capacitors are equivalent capacitors, in which each the first terminal of a first set of the 2(2(N+1)−2) capacitors is electrically connected to the positive input terminal, each the first terminal of the other set of the 2(2(N+1)−2) capacitors is electrically connected to the negative input terminal and each of the first set and the other set of the 2(2(N+1)−2) capacitors has (2(N+1)−2) capacitors.

The aforementioned first and second preferred embodiments of the present invention can be further generalized to become the third preferred embodiment of the present invention, which is a method for adjusting a subrange analog-to-digital converter (ADC) and comprises steps of: providing 2(2(N+1)−2) capacitors, each of which has a first and a second terminals, and which capacitors are divided into N groups, wherein the N groups represent N bits, each of which electrically connects with at least one of the capacitors, the first terminal receives an input signal, and the second terminal selectively receives one of a first and a second reference voltages; comparing respectively a positive and a negative voltage values generated via the input signal with two sets of divided voltages to generate two sets of output signals; and determining simultaneously whether to adjust a voltage value of each the capacitor of each the bit of the N groups according to the two sets of 2(2(N+1)−2) output signals, wherein each of the two sets of divided voltages has (2(N+1)−2) voltages and each of the two sets of output signals has (2(N+1)−2) output signals.

The above-mentioned method proposed according to the third preferred embodiment of the present invention further comprises a step of generating N digital codes respectively corresponding to the N bits according to the voltage value of each the capacitor representative of each the bit of the N groups after an adjustment in the determining step is finished.

In the aforementioned method proposed according to the third preferred embodiment of the present invention, the subrange ADC has M bits counted from a most significant bit (MSB) to a least significant bit (LSB), and the above-mentioned method further comprises steps of: providing a capacitor array having at least one capacitor with a first and a second terminals and configured to be one of the remaining (M−N) bits and the remaining (M−N−1) bits of the M bits, wherein each the bit electrically connects with the at least one capacitor, the first terminal receives the input signal and the second terminal selectively receives one of a first and a second reference voltages; applying a binary search algorithm to adjust a potential level of each bit in the one of the remaining M−N bits and the remaining M−N−1 bits of the M bits to generate additional digital codes of one of (M−N) bits and (M−N−1) bits corresponding to the one of the remaining (M−N) bits and the remaining (M−N−1) bits; and applying a top plate sampling method to obtain the digital codes of M−N bits when the second capacitor array is configured to be the remaining M−N−1 bits.

In the above-mentioned method proposed according to the third preferred embodiment of the present invention, wherein the providing step further comprises a step of providing a voltage divider, wherein all of the capacitors have an equivalent capacitance and the two sets of divided voltages are generated by the voltage divider when the first and the second reference voltages are respectively applied thereacross.

Figure 11A:
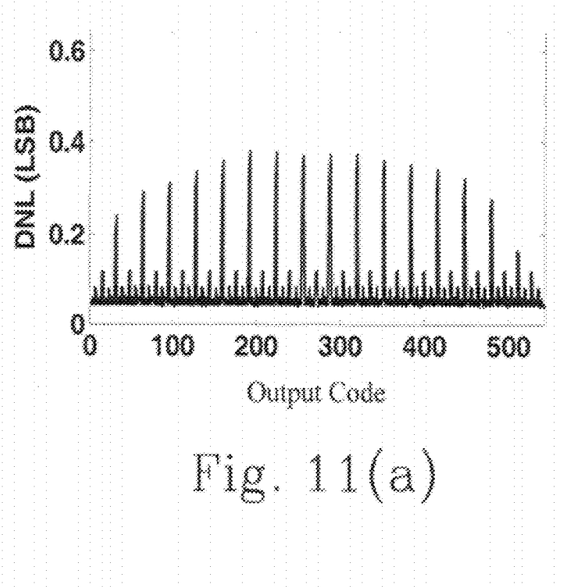
FIGS. 11(a) and 11(b) respectively show a schematic diagram of a DNL of rms of the subrange ADC according to the first preferred embodiment of the present invention and a schematic diagram of a DNL of rms of a conventional SAR ADC.
Figure 11B:
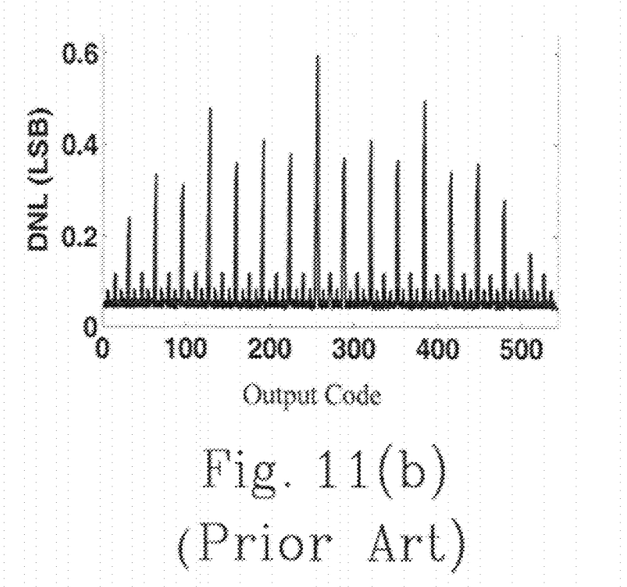
Figure 11C:
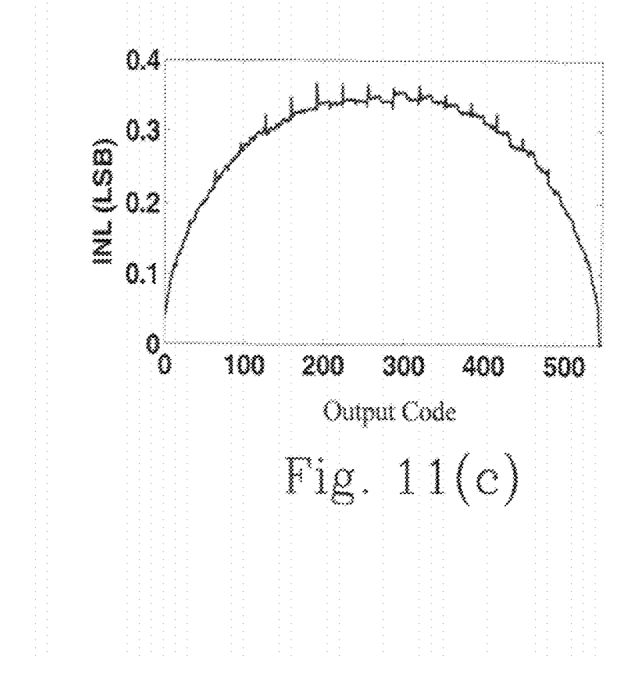
FIGS. 11(c) and 11(d) respectively show a schematic diagram of an INL of rms of the subrange ADC according to the first preferred embodiment of the present invention and a schematic diagram of an INL of rms of a conventional SAR ADC.
Figure 11D:
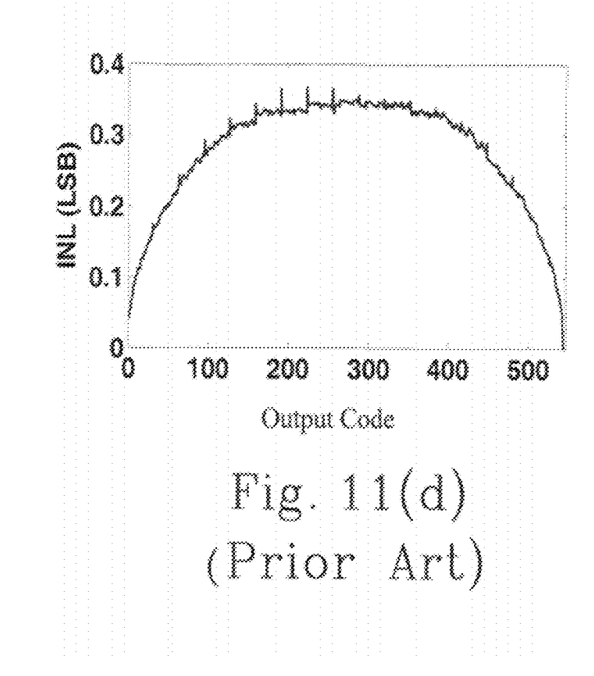

FIGS. 11(a) and 11(b) respectively shows a schematic diagram of a DNL of root mean square (rms) of the subrange ADC according to the first preferred embodiment of the present invention and a schematic diagram of a DNL of rms of a conventional SAR ADC. FIGS. 11(c) and 11(d) respectively shows a schematic diagram of an INL of rms of the subrange ADC according to the first preferred embodiment of the present invention and a schematic diagram of an INL of rms of a conventional SAR ADC. FIGS. 11(a)-11(d) are the results of simulation and analysis via using the model set up by the Matlab software. A mismatch is added to the capacitor (a standard deviation is 3%). There are in total 10,000 times of simulations, the rms results of the conventional method are shown in FIGS. 11(a) and 11(c), and the rms results according to the first preferred embodiment of the present invention are shown in FIGS. 11(b) and 11(d). It could be observed from FIGS. 11(a)-11(d) that the DNL of the subrange ADC proposed according to the first preferred embodiment of the present invention is improved significantly while compared with the DNL of the conventional SAR ADC, although there seems no significant change between the INL of the proposed subrange ADC and that of the conventional SAR ADC.

EMBODIMENTS

1. A subrange analog-to-digital converter (ADC) with M bits, comprising:
a positive and a negative input terminals;
a first capacitor array having 2(2(N+1)−2) equivalent capacitors, each of which has a first and a second terminals, divided into N groups representing the first N bits of the M bits counted from a most significant bit (MSB) to a least significant bit (LSB);
a successive approximation ADC (SAR ADC) including a second capacitor array having a plurality of bits and at least one capacitor with a first and a second terminals, wherein each the bit of the first and the second capacitor arrays electrically connects with at least one of the capacitors, the first terminal electrically connects with one of the positive and negative input terminals, and the second terminal switchably connects with a first and a second reference voltage sources to selectively receive a first and a second reference voltages; and
a flash ADC receiving the first and the second reference voltages and a positive and a negative input voltages from the positive and the negative input terminals, generating two output signal sets, each of which has (2(N+1)−2) output signals, and simultaneously determining whether to adjust respective potential levels of the N bits represented by the N groups according to the two output signal sets.

2. A converter according to Embodiment 1 further comprising a first and a second bootstrapped switches, an error correction circuit and a comparator electrically connected to the positive and the negative terminals, wherein the positive and the negative input terminals receive an input signal, the input signal is a differential signal, the first and the second bootstrapped switches are respectively connected between the positive input terminal and the comparator, and between the negative input terminal and the comparator for completely passing the differential signal through the positive and the negative input terminals, the SAR ADC includes a first digital control circuit, the flash ADC includes a second digital control circuit, and the error correction circuit electrically connects with the SAR ADC and the flash ADC and generates a digital code matched to the input signal.

3. A converter according to Embodiment 1 or 2, wherein the second capacitor array is configured to be one of the remaining M−N bits and the remaining M−N−1 bits of the M bits, the comparator has a comparison result, the comparison result and a binary search algorithm are used to adjust respective potential levels of one of the remaining M−N bits and the remaining M−N−1 bits of the M bits to generate the digital code, and a top plate sampling method is used to obtain the M−N bits of the digital code when the second capacitor array is configured to be the remaining M−N−1 bits.

4. A converter according to anyone of the above-mentioned Embodiments, wherein the flash ADC comprises a reference voltage generating circuit formed by 2(N+1)−2 resistors electrically connected in series, and except the first and the last resistors have a respective relatively higher first resistance, the remaining 2(N+1)−4 resistors all have a respective relatively lower second resistance to generate a reference voltage required by an offset tolerance capability of the reference voltage generating circuit.

5. A converter according to anyone of the above-mentioned Embodiments, wherein the flash ADC is an N.5-bit flash ADC, generates N+1 output signals and generates the digital code corresponding to the first N bits via the error correction circuit such that a generation of an offset is tolerated.

6. A subrange analog-to-digital converter (ADC) with M bits, comprising:

a positive and a negative input terminals;

a first capacitor array having 2(2(N+1)−2) capacitors, each of which has a first and a second terminals, divided into N groups representing the first N bits of M bits counted from a most significant bit (MSB) to a least significant bit (LSB), wherein each the bit electrically connects with at least one of the capacitors, the first terminal electrically connects with one of the positive and negative input terminals, and the second terminal switchably connects with a first and a second reference voltage sources to selectively receive a first and a second reference voltages; and a flash ADC comprising a reference voltage generating circuit formed by 2(N+1)−2 resistors electrically connected in series, receiving the first and the second reference voltages and a positive and a negative input voltages from the positive and the negative input terminals, and simultaneously determining whether to adjust potential levels of the bits of the N groups and a voltage value of the at least one of the capacitors, wherein except each of the first and the last resistors has a relatively higher first resistance, each of the remaining 2(N+1)−4 resistors has a relatively lower second resistance to generate a reference voltage required by an offset tolerance capability of the reference voltage generating circuit.

7. A converter according to Embodiment 6, wherein the 2(2(N+1)−2) capacitors are equivalent capacitors, in which each the first terminal of a first set of the 2(2(N+1)−2) capacitors is electrically connected to the positive input terminal, each the first terminal of the other set of the 2(2(N+1)−2) capacitors is electrically connected to the negative input terminal and each of the first set and the other set of the 2(2(N+1)−2) capacitors has (2(N+1)−2) capacitors.

8. A converter according to Embodiment 6 or 7 further comprising a successive approximation ADC (SAR ADC) including a second capacitor array having a plurality of bits and at least one of the capacitors with a first and a second terminals, wherein each the bit of the first and the second capacitor arrays electrically connects with at least one the capacitors, the first terminal electrically connects with one of the positive and negative input terminals, and the second terminal switchably connects with a first and a second reference voltage sources to selectively receive a first and a second reference voltages.

9. A converter according to anyone of the above-mentioned Embodiments further comprising a first and a second bootstrapped switches, an error correction circuit and a comparator electrically connected to the positive and the negative terminals, wherein the positive and the negative input terminals receive an input signal, the input signal is a differential signal, the first and the second bootstrapped switches are respectively connected between the positive input terminal and the comparator, and between the negative input terminal and the comparator for completely passing the differential signal through the positive and the negative input terminals, the SAR ADC includes a first digital control circuit, the flash ADC includes a second digital control circuit, and the error correction circuit electrically connects with the SAR ADC and the flash ADC and generates a digital code matched to the input signal.

10. A converter according to anyone of the above-mentioned Embodiments, wherein the second capacitor array is configured to be one of the remaining M−N bits and the remaining M−N−1 bits of the M bits, the comparator has a comparison result, the comparison result and a binary search algorithm are used to adjust respective potential levels of one of the remaining M−N bits and the remaining M−N−1 bits of the M bits to generate the digital code, and a top plate sampling method is used to obtain the M−N bits of the digital code when the second capacitor array is configured to be the remaining M−N−1 bits.

11. A converter according to anyone of the above-mentioned Embodiments, wherein the flash ADC is an N.5-bit flash ADC, generates N+1 output signals and generates the digital code corresponding to the first N bits via the error correction circuit such that a generation of an offset is tolerated.

12. A method for adjusting a subrange analog-to-digital converter (ADC), comprising steps of:

providing 2(2(N+1)−2) capacitors, each of which has a first and a second terminals, and which capacitors are divided into N groups, wherein the N groups represent N bits, each of which electrically connects with at least one of the capacitors, the first terminal receives an input signal, and the second terminal selectively receives one of a first and a second reference voltages;

comparing respectively a positive and a negative voltage values generated via the input signal with two sets of divided voltages to generate two sets of output signals; and determining simultaneously whether to adjust a voltage value of each the capacitor of each the bit of the N groups according to the two sets of 2(2(N+1)−2) output signals.

13. A method according to Embodiment 12, wherein each of the two sets of divided voltages has (2(N+1)−2) voltages and each of the two sets of output signals has (2(N+1)−2) output signals.

14. A method according to Embodiment 12 or 13 further comprising a step of generating N digital codes respectively corresponding to the N bits according to the voltage value of each the capacitor representative of each the bit of the N groups after an adjustment in the determining step is finished.

15. A method according to anyone of the above-mentioned Embodiments, wherein the subrange ADC has M bits counted from a most significant bit (MSB) to a least significant bit (LSB), further comprising steps of:

providing a capacitor array having at least one capacitor with a first and a second terminals and configured to be one of the remaining (M−N) bits and the remaining (M−N−1) bits of the M bits, wherein each the bit electrically connects with the at least one capacitor, the first terminal receives the input signal and the second terminal selectively receives one of a first and a second reference voltages;

applying a binary search algorithm to adjust a potential level of each bit in the one of the remaining M−N bits and the remaining M−N−1 bits of the M bits to generate additional digital codes of one of (M−N) bits and (M−N−1) bits corresponding to the one of the remaining (M−N) bits and the remaining (M−N−1) bits; and applying a top plate sampling method to obtain the digital codes of M−N bits when the second capacitor array is configured to be the remaining M−N−1 bits.

16. A method according to anyone of the above-mentioned Embodiments, wherein the providing step further comprises a step of providing a voltage divider, wherein all of the capacitors have an equivalent capacitance and the two sets of divided voltages are generated by the voltage divider when the first and the second reference voltages are respectively applied thereacross.

According to the aforementioned descriptions, the present invention provides a subrange ADC includes a X.5-bit flash ADC, a Y-bit SAR ADC and a (X+Y)-bit segmented capacitive digital-to-analog converter (DAC), the flash ADC controls thermometer coarse capacitors of the DAC and the SAR ADC controls the binary fine capacitors; compared with a pure binary DAC, the thermometer DAC improves differential non-linearity (DNL) generated while the large capacitors are switching, and due to that the flash ADC engages the analog-to-digital conversions of the X bits simultaneously, the sampling speed of the subrange ADC as a whole is also raised so as to possess the non-obviousness and the novelty.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A subrange analog-to-digital converter (ADC) with M bits, comprising:
   a positive and a negative input terminals;
   a first capacitor array having $2(2(N+1)-2)$ equivalent capacitors, each of which has a first and a second terminals, divided into N groups representing the first N bits of the M bits counted from a most significant bit (MSB) to a least significant bit (LSB);
   a successive approximation ADC (SAR ADC) including a second capacitor array having a plurality of bits and at least one capacitor with a first and a second terminals, wherein each the bit of the first and the second capacitor arrays electrically connects with at least one of the capacitors, the first terminal electrically connects with one of the positive and negative input terminals, and the second terminal switchably connects with a first and a second reference voltage sources to selectively receive a first and a second reference voltages; and
   a flash ADC receiving the first and the second reference voltages and a positive and a negative input voltages from the positive and the negative input terminals, generating two output signal sets, each of which has $(2(N+1)-2)$ output signals, and simultaneously determining whether to adjust respective potential levels of the N bits represented by the N groups according to the two output signal sets.

2. A converter according to claim 1 further comprising a first and a second bootstrapped switches, an error correction circuit and a comparator electrically connected to the positive and the negative terminals, wherein the positive and the negative input terminals receive an input signal, the input signal is a differential signal, the first and the second bootstrapped switches are respectively connected between the positive input terminal and the comparator, and between the negative input terminal and the comparator for completely passing the differential signal through the positive and the negative input terminals, the SAR ADC includes a first digital control circuit, the flash ADC includes a second digital control circuit, and the error correction circuit electrically connects with the SAR ADC and the flash ADC and generates a digital code matched to the input signal.

3. A converter according to claim 2, wherein the second capacitor array is configured to be one of the remaining M−N bits and the remaining M−N−1 bits of the M bits, the comparator has a comparison result, the comparison result and a binary search algorithm are used to adjust respective potential levels of one of the remaining M−N bits and the remaining M−N−1 bits of the M bits to generate the digital code, and a top plate sampling method is used to obtain the M−N bits of the digital code when the second capacitor array is configured to be the remaining M−N−1 bits.

4. A converter according to claim 1, wherein the flash ADC comprises a reference voltage generating circuit formed by $2(N+1)-2$ resistors electrically connected in series, and except the first and the last resistors have a respective relatively higher first resistance, the remaining $2(N+1)-4$ resistors all have a respective relatively lower second resistance to generate a reference voltage required by an offset tolerance capability of the reference voltage generating circuit.

5. A converter according to claim 1, wherein the flash ADC is an N.5-bit flash ADC, generates N+1 output signals and generates the digital code corresponding to the first N bits via the error correction circuit such that a generation of an offset is tolerated.

6. A subrange analog-to-digital converter (ADC) with M bits, comprising:
   a positive and a negative input terminals;
   a first capacitor array having $2(2(N+1)-2)$ capacitors, each of which has a first and a second terminals, divided into N groups representing the first N bits of M bits counted from a most significant bit (MSB) to a least significant bit (LSB), wherein each the bit electrically connects with at least one of the capacitors, the first terminal electrically connects with one of the positive and negative input terminals, and the second terminal switchably connects with a first and a second reference voltage sources to selectively receive a first and a second reference voltages; and
   a flash ADC comprising a reference voltage generating circuit formed by $2(N+1)-2$ resistors electrically connected in series, receiving the first and the second reference voltages and a positive and a negative input voltages from the positive and the negative input terminals, and simultaneously determining whether to adjust potential levels of the bits of the N groups and a voltage value of the at least one of the capacitors, wherein except each of the first and the last resistors has a relatively higher first resistance, each of the remaining 2(N+1)−4 resistors has a relatively lower second resistance to generate a reference voltage required by an offset tolerance capability of the reference voltage generating circuit.

7. A converter according to claim 6, wherein the 2(2(N+1)−2) capacitors are equivalent capacitors, in which each the first terminal of a first set of the 2(2(N+1)−2) capacitors is electrically connected to the positive input terminal, each the first terminal of the other set of the 2(2(N+1)−2) capacitors is electrically connected to the negative input terminal and each of the first set and the other set of the 2(2(N+1)−2) capacitors has (2(N+1)−2) capacitors.

8. A converter according to claim 6 further comprising a successive approximation ADC (SAR ADC) including a second capacitor array having a plurality of bits and at least one of the capacitors with a first and a second terminals, wherein each the bit of the first and the second capacitor arrays electrically connects with at least one the capacitors, the first terminal electrically connects with one of the positive and negative input terminals, and the second terminal switchably connects with a first and a second reference voltage sources to selectively receive a first and a second reference voltages.

9. A converter according to claim 8 further comprising a first and a second bootstrapped switches, an error correction circuit and a comparator electrically connected to the positive and the negative terminals, wherein the positive and the negative input terminals receive an input signal, the input signal is a differential signal, the first and the second bootstrapped switches are respectively connected between the positive input terminal and the comparator, and between the negative input terminal and the comparator for completely passing the differential signal through the positive and the negative input terminals, the SAR ADC includes a first digital control circuit, the flash ADC includes a second digital control circuit, and the error correction circuit electrically connects with the SAR ADC and the flash ADC and generates a digital code matched to the input signal.

10. A converter according to claim 9, wherein the second capacitor array is configured to be one of the remaining M−N bits and the remaining M−N−1 bits of the M bits, the comparator has a comparison result, the comparison result and a binary search algorithm are used to adjust respective potential levels of one of the remaining M−N bits and the remaining M−N−1 bits of the M bits to generate the digital code, and a top plate sampling method is used to obtain the M−N bits of the digital code when the second capacitor array is configured to be the remaining M−N−1 bits.

11. A converter according to claim 9, wherein the flash ADC is an N.5-bit flash ADC, generates N+1 output signals and generates the digital code corresponding to the first N bits via the error correction circuit such that a generation of an offset is tolerated.

12. A method for adjusting a subrange analog-to-digital converter (ADC), comprising steps of:
providing 2(2(N+1)−2) capacitors, each of which has a first and a second terminals, and which capacitors are divided into N groups, wherein the N groups represent N bits, each of which electrically connects with at least one of the capacitors, the first terminal receives an input signal, and the second terminal selectively receives one of a first and a second reference voltages;
comparing respectively a positive and a negative voltage values generated via the input signal with two sets of divided voltages to generate two sets of output signals; and
determining simultaneously whether to adjust a voltage value of each the capacitor of each the bit of the N groups according to the two sets of 2(2(N+1)−2) output signals.

13. A method according to claim 12, wherein each of the two sets of divided voltages has (2(N+1)−2) voltages and each of the two sets of output signals has (2(N+1)−2) output signals.

14. A method according to claim 12 further comprising a step of generating N digital codes respectively corresponding to the N bits according to the voltage value of each the capacitor representative of each the bit of the N groups after an adjustment in the determining step is finished.

15. A method according to claim 14, wherein the subrange ADC has M bits counted from a most significant bit (MSB) to a least significant bit (LSB), further comprising steps of:
providing a capacitor array having at least one capacitor with a first and a second terminals and configured to be one of the remaining (M−N) bits and the remaining (M−N−1) bits of the M bits, wherein each the bit electrically connects with the at least one capacitor, the first terminal receives the input signal and the second terminal selectively receives one of a first and a second reference voltages;
applying a binary search algorithm to adjust a potential level of each bit in the one of the remaining M−N bits and the remaining M−N−1 bits of the M bits to generate additional digital codes of one of (M−N) bits and (M−N−1) bits corresponding to the one of the remaining (M−N) bits and the remaining (M−N−1) bits; and
applying a top plate sampling method to obtain the digital codes of M−N bits when the second capacitor array is configured to be the remaining M−N−1 bits.

16. A method according to claim 12, wherein the providing step further comprises a step of providing a voltage divider, wherein all of the capacitors have an equivalent capacitance and the two sets of divided voltages are generated by the voltage divider when the first and the second reference voltages are respectively applied thereacross.

* * * * *